United States Patent
Chung et al.

(10) Patent No.: US 12,009,328 B2
(45) Date of Patent: *Jun. 11, 2024

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Hyunsoo Chung, Hwaseong-si (KR); Taewon Yoo, Seoul (KR); Myungkee Chung, Sheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 155 days.

This patent is subject to a terminal disclaimer.

(21) Appl. No.: 17/715,479

(22) Filed: Apr. 7, 2022

(65) Prior Publication Data

US 2022/0230977 A1 Jul. 21, 2022

Related U.S. Application Data

(63) Continuation of application No. 16/923,428, filed on Jul. 8, 2020, now Pat. No. 11,362,054.

(30) Foreign Application Priority Data

Feb. 14, 2020 (KR) .......................... 10-2020-0018288

(51) Int. Cl.
H01L 23/00 (2006.01)
(52) U.S. Cl.
CPC .............. *H01L 24/13* (2013.01); *H01L 24/03* (2013.01); *H01L 24/05* (2013.01); *H01L 24/11* (2013.01);

(Continued)

(58) Field of Classification Search
CPC H01L 24/13; H01L 24/05; H01L 2224/05551
See application file for complete search history.

(56) References Cited

U.S. PATENT DOCUMENTS 7,663,250 B2 2/2010 Jeon et al.
8,084,871 B2 12/2011 Rahim et al.
(Continued)

FOREIGN PATENT DOCUMENTS

JP 2013-030498 A 2/2013
KR 10-2004-0083192 A 10/2004
(Continued)

OTHER PUBLICATIONS

Office Action dated Feb. 5, 2024 from the Korean Intellectual Property Office (KIPO) for corresponding Korean Patent Application No. 10-2020-0018288.

*Primary Examiner* — Dale E Page
*Assistant Examiner* — Wilner Jean Baptiste
(74) *Attorney, Agent, or Firm* — Muir Patent Law, PLLC

(57) ABSTRACT

A semiconductor package includes a chip including a pad; a first insulation pattern on the chip and exposing the pad; a redistribution layer (RDL) on an upper surface of the first insulation pattern and connected to the pad; a second insulation pattern on the upper surface of the first insulation pattern and including an opening exposing a ball land of the RDL and a patterned portion in the opening; an under bump metal (UBM) on upper surfaces of the second insulation pattern and patterned portion and filling the opening, the UBM including a first locking hole exposing an edge of an upper surface of the ball land; and a conductive ball on an upper surface of the UBM and including a first locking portion in the first locking hole. The first locking hole may be about 10% to about 50% of the area of the UBM upper surface.

20 Claims, 14 Drawing Sheets

(52) U.S. Cl.
CPC ............ *H01L 2224/02371* (2013.01); *H01L 2224/0401* (2013.01); *H01L 2224/05551* (2013.01)

(56) References Cited

U.S. PATENT DOCUMENTS

| | | |
|---|---|---|
| 8,912,668 B2 | 12/2014 | Chen et al. |
| 9,716,071 B2 | 7/2017 | Ryu et al. |
| 10,109,607 B2 | 10/2018 | Chen et al. |
| 11,362,054 B2 * | 6/2022 | Chung ................... H01L 24/03 |
| 2005/0116354 A1 * | 6/2005 | Kashiwazaki .... H01L 23/49838 |
| | | 257/E23.07 |
| 2005/0282315 A1 | 12/2005 | Jeong et al. |
| 2010/0283148 A1 | 11/2010 | Tsai et al. |
| 2013/0161702 A1 | 6/2013 | Chen |
| 2013/0228897 A1 | 9/2013 | Chen et al. |
| 2017/0053883 A1 | 2/2017 | How et al. |
| 2017/0278812 A1 | 9/2017 | Lee et al. |
| 2019/0131221 A1 | 5/2019 | Lee et al. |

FOREIGN PATENT DOCUMENTS

| | | |
|---|---|---|
| KR | 10-1067106 B1 | 9/2011 |
| KR | 10-1683972 B1 | 12/2016 |

\* cited by examiner

SEMICONDUCTOR PACKAGE AND METHOD OF MANUFACTURING THE SAME

CROSS-REFERENCE TO RELATED APPLICATIONS

This is a continuation application based on pending U.S. application Ser. No. 16/923,428, filed on Jul. 8, 2020, the entire contents of which is hereby incorporated by reference.

Korean Patent Application No. 10-2020-0018288, filed on Feb. 14, 2020, in the Korean Intellectual Property Office, and entitled: "Semiconductor Package and Method of Manufacturing the Same," is incorporated by reference herein in its entirety.

BACKGROUND

1. Field

Embodiments relate to a semiconductor package and a method of manufacturing the same.

2. Description of the Related Art

Generally, a wafer level package may include a semiconductor chip, a first insulation pattern, a redistribution layer (RDL), a second insulation pattern, an under bump metal (UBM), and a conductive ball.

SUMMARY

Embodiments are directed to a semiconductor package, including a semiconductor chip including a pad; a first insulation pattern on an upper surface of the semiconductor chip and exposing the pad; a redistribution layer (RDL) on an upper surface of the first insulation pattern and electrically connected to the pad; a second insulation pattern on the upper surface of the first insulation pattern, the second insulation pattern including at least one opening that exposes a ball land of the RDL and at least one patterned portion located in the opening; an under bump metal (UBM) on upper surfaces of the second insulation pattern and the patterned portion and filling the opening, the UBM including a first locking hole that exposes an edge portion of an upper surface of the ball land; and a conductive ball on an upper surface of the UBM, the conductive ball including a first locking portion in the first locking hole. The first locking hole may have an area of about 10% to about 50% of an area of the upper surface of the UBM.

Embodiments are also directed to a semiconductor package, including a semiconductor chip including a pad; a first insulation pattern on an upper surface of the semiconductor chip and exposes the pad; a redistribution layer (RDL) on an upper surface of the first insulation pattern and electrically connected to the pad; a second insulation pattern on the upper surface of the first insulation pattern, the second insulation pattern including at least one opening that exposes a ball land of the RDL and at least one patterned portion located in the opening; an under bump metal (UBM) on upper surfaces of the second insulation pattern and the patterned portion and filling the opening, the UBM including a locking hole; and a conductive ball on an upper surface of the UBM, the conductive ball including a locking portion in the locking hole.

Embodiments are also directed to a method of manufacturing a semiconductor package, the method including forming a first insulation pattern on an upper surface of a semiconductor chip to expose a pad of the semiconductor chip; forming a redistribution layer (RDL) on an upper surface of the first insulation pattern, the RDL being electrically connected to the pad; forming a second insulation pattern on the upper surface of the first insulation pattern, the second insulation pattern including at least one opening that exposes a ball land of the RDL and including at least one patterned portion located in the opening; forming an under bump metal (UBM) on upper surfaces of the second insulation pattern and the patterned portion to fill the opening, the UBM including a locking hole that exposes the ball land; and forming a conductive ball on an upper surface of the UBM, the conductive ball including a locking portion inserted into the locking hole.

BRIEF DESCRIPTION OF THE DRAWINGS

Features will become apparent to those of skill in the art by describing in detail exemplary embodiments with reference to the attached drawings in which:

FIG. 10 is an enlarged plan view illustrating a UBM of the semiconductor package in

FIG. 9;

DETAILED DESCRIPTION

Figure 1:
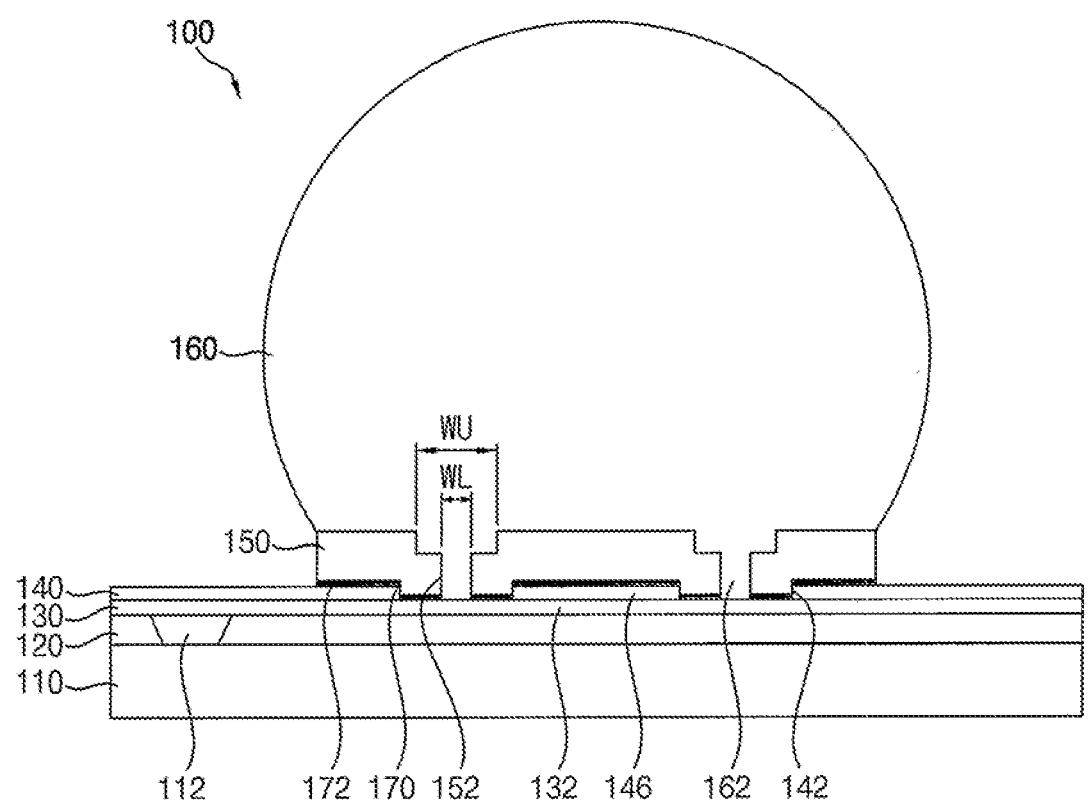
FIG. 1 is a cross-sectional view illustrating a semiconductor package in accordance with an example embodiment.
Figure 2A:
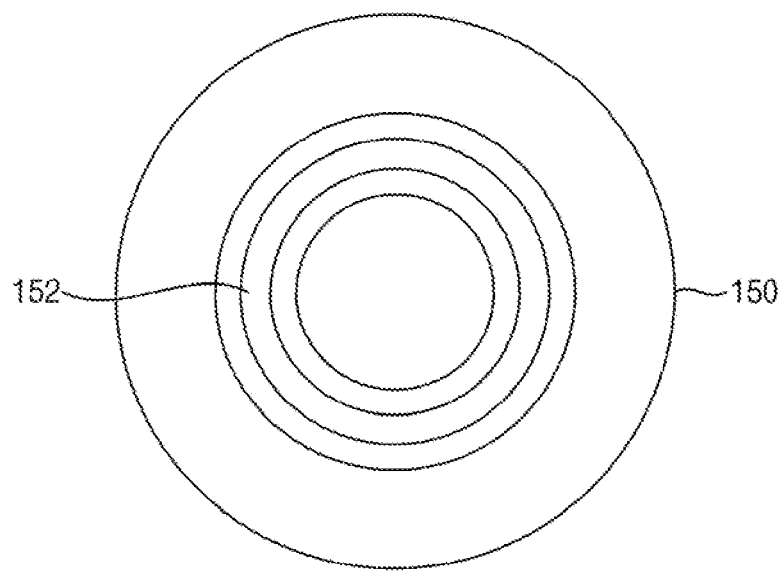
FIGS. 2A and 2B are enlarged plan views illustrating a UBM of the semiconductor package in FIG. 1.
Figure 2B:
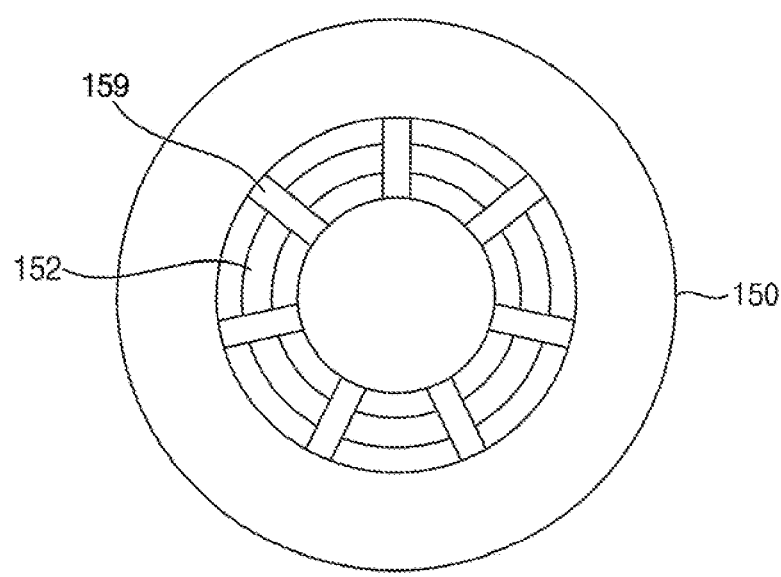

FIG. 1 is a cross-sectional view illustrating a semiconductor package in accordance with an example embodiment, and FIGS. 2A and 2B are enlarged plan views illustrating a UBM of the semiconductor package in FIG. 1.

A semiconductor package 100 in accordance with the present example embodiment may correspond to a wafer level package. The wafer level package may be manufactured by performing a packaging process on a plurality of semiconductor chips 110 in a wafer, and by cutting scribe lanes of the wafer. FIG. 1 shows an example corresponding to one semiconductor chip 110 among the plurality of semiconductor chips 110 in the wafer.

Referring to FIG. 1, the semiconductor package 100 may include the semiconductor chip 110, a first insulation pattern 120, a redistribution layer (RDL) 130, a second insulation pattern 140, an under bump metal (UBM) 150, a conductive ball 160, a barrier layer 170 and a seed layer 172.

The semiconductor chip 110 may include a pad 112. The pad 112 may be arranged on an upper surface of the semiconductor chip 110.

The first insulation pattern 120 may be formed on the upper surface of the semiconductor chip 110. The first insulation pattern 120 may have an opening that exposes the pad 112. The first insulation pattern 120 may include an insulation material, for example, a photosensitive insulation material.

The RDL 130 may be formed on an upper surface of the first insulation pattern 120. The RDL 130 may include a first end electrically connected to the pad 112. A second end of the RDL 130 may extend along the upper surface of the first insulation pattern 120.

The second insulation pattern 140 may be formed on the upper surface of the first insulation pattern 120. The second insulation pattern 140 may have an opening 142 that exposes the second end of the RDL 130. The second end of the RDL 130 exposed through the opening 142 of the second insulation pattern 140 may correspond to a ball land 132 on which the conductive ball 160 may be mounted.

In an example embodiment, the opening 142 may have an annular shape. Thus, the second insulation pattern 140 may include a circular patterned portion 146 surrounded by the annular opening 142. A shape of the patterned portion 146 may be determined by a shape of the opening 142, and the shapes of the opening 142 and the patterned portion 146 may be varied.

The UBM 150 may be formed on upper surfaces of the second insulation pattern 140 and the patterned portion 146. The UBM 150 may be configured to fully fill the opening 142 of the second insulation pattern 140. Thus, the UBM 150 may be electrically connected with the ball land 132 of the RDL 130 exposed through the opening 142 of the second insulation pattern 140. The UBM 150 may include a metal such as copper, nickel, etc. The UBM 150 may function as to improve adhesion force of the conductive ball 160, to prevent a diffusion of solder in the conductive ball 160 into the ball land 132, etc.

In an example embodiment, the UBM 150 may include a first locking hole 152. The first locking hole 152 may be vertically formed through the UBM 150. The first locking hole 152 may expose an upper surface of the ball land 132 of the RDL 130. For example, the first locking hole 152 may expose an edge portion of the upper surface of the ball land 132. The first locking hole 152 may include a stepped structure having an upper width WU and a lower width WL narrower than the upper width WU. For example, the first locking hole 152 may include an upper hole having the upper width WU and a lower hole having the lower width WL connected to the upper hole. In another implementation, the first locking hole 152 may include a stepped structure having an upper width WU and a lower width WL wider than the upper width WU. Further, the first locking hole 152 may have a uniform width.

Referring to FIG. 2A, the first locking hole 152 may have an annular shape. The UBM 150 may include an inner portion and outer portion separated from the inner portion by the annular first locking hole 152. In another implementation, the first locking hole 152 may have a polygonal shape besides the annular shape.

Referring to FIG. 2B, the UBM 150 may further include a plurality of branches 159 crossing the first locking hole 152 in a radial direction of the UBM 150. The branches 159 may be configured to connect the inner portion and the outer portion of the UBM 150, which may be divided by the first locking hole 152, with each other.

The conductive ball 160 may be mounted on the upper surface of the UBM 150. The conductive ball 160 may include a first locking portion 162 inserted into the first locking hole 152. The first locking portion 162 may fill the first locking hole 152. Thus, the first locking portion 162 may make contact with an inner surface of the first locking hole 152. Because the first locking hole 152 may have the annular shape, the first locking portion 162 may also have an annular shape. Therefore, a shape of the first locking portion 162 may be changed in accordance with a shape of the first locking hole 152. The conductive ball 160 may include solder.

In an example embodiment, the ball land 132 of the RDL 130 may be exposed through the first locking hole 152. Thus, the first locking portion 162 inserted into the first locking hole 152 may directly make contact with the ball land 132 of the RDL 130.

When the area of the first locking hole 152 may be about 10% or more of an area of the upper surface of the UBM 150, the adhesion force between the conductive ball 160 and the UBM 150 may be significantly increased by the first locking portion 162. When the area of the first locking hole 152 may be about 50% or less of the area of the upper surface of the UBM 150, a contact area between the conductive ball 160 and the UBM 150 may be ensured to thus provide a reliable electrical connection between the conductive ball 160 and the UBM 150. Thus, the area of the first locking hole 152 may be about 10% to about 50% of the area of the upper surface of the UBM 150.

The barrier layer 170 may be interposed between the second insulation pattern 140 and the UBM 150, and interposed between the UBM 150 and the RDL 130. The seed layer 172 may be interposed between the barrier layer 170 and the UBM 150, and interposed between the barrier layer 170 and the UBM 150. The seed layer 172 may be used for a plating process for forming the UBM 150. The barrier layer 170 may reinforce the adhesion force between the seed layer 172 and the second insulation pattern 140. The barrier layer 170 may include, for example, titanium, and the seed layer 172 may include, for example, copper.

According to an example embodiment, the first locking portion 162 of the conductive ball 160 may make contact with the inner surface of the first locking hole 152 to increase the contact area between the UBM 150 and the conductive ball 160. Further, the first locking portion 162 inserted into the first locking hole 152 and the UBM 150 may form an uneven structure to reinforce a combination structure between the conductive ball 160 and the UBM 150. As a result, the adhesion force between the conductive ball 160 and the UBM 150 may be significantly increased to prevent a joint region between the conductive ball 160 and the UBM 150 from being damaged by a difference of thermal expansion coefficients between the RDL 130 and the first and second insulation patterns 120 and 140.

FIGS. 3 to 8 are cross-sectional views illustrating a method of manufacturing the semiconductor package in FIG. 1.

Figure 3:
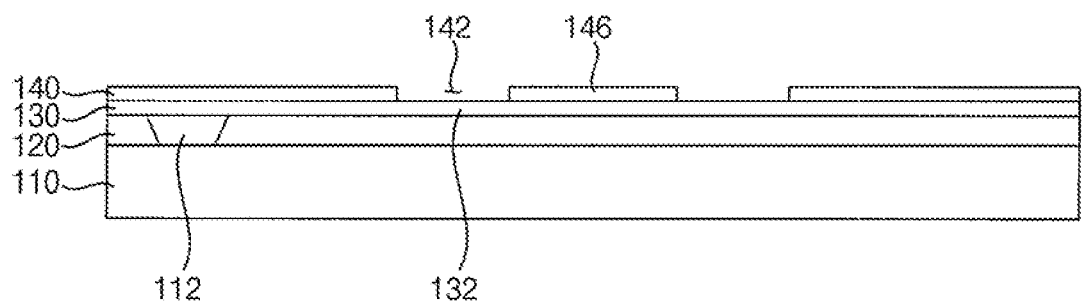
FIGS. 3 to 8 are cross-sectional views illustrating a method of manufacturing the semiconductor package in FIG. 1.

Referring to FIG. 3, the first insulation pattern 120 may be formed on the upper surface of the semiconductor chip 110. The pad 112 of the semiconductor chip 110 may be exposed through the opening of the first insulation pattern 120. The RDL 130 may be formed on the upper surface of the first insulation pattern 120. The RDL 130 may be electrically connected to the pad 112.

The second insulation pattern 140 may be formed on the upper surface of the first insulation pattern 120. The ball land 132 of the RDL 130 may be exposed through the opening 142 of the second insulation pattern 140. The patterned portion 146 may be located at a central portion of the ball land 132.

Figure 4:
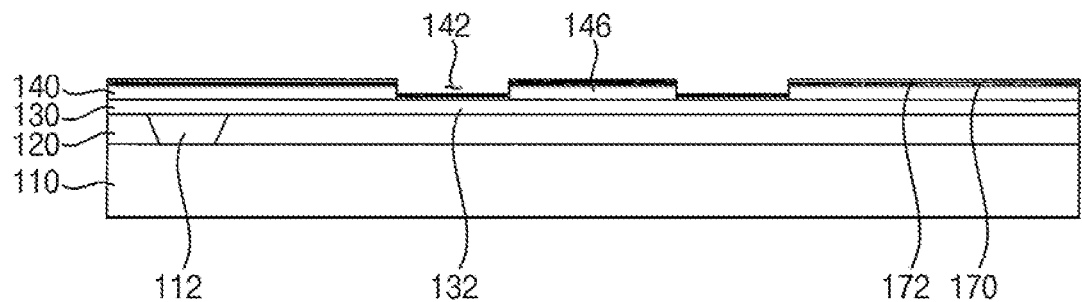

Referring to FIG. 4, the barrier layer 170 and the seed layer 172 may be sequentially formed on the upper surfaces of the second insulation pattern 140, the patterned portion 146, and the RDL 130. The barrier layer 170 may include, for example, titanium and the seed layer 172 may include, for example, copper. The barrier layer 170 may function to reinforce the adhesion force between the seed layer 172 and the second insulation pattern 140.

Figure 5:
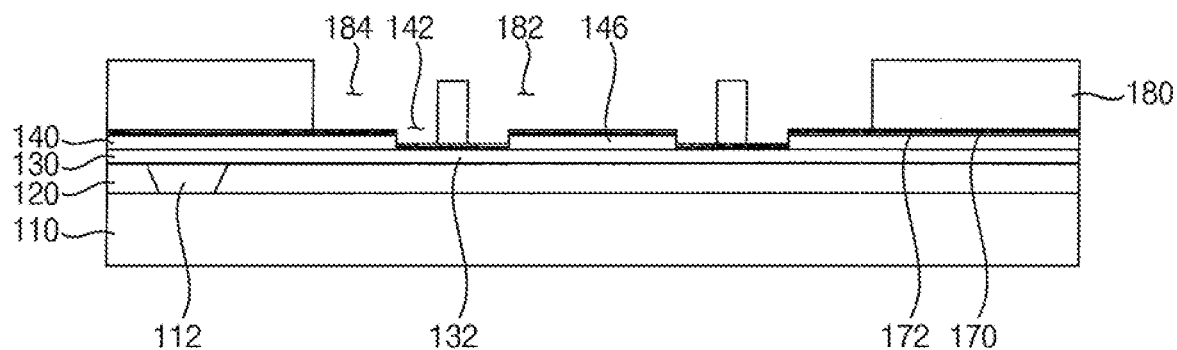

Referring to FIG. 5, a photoresist pattern 180 may be formed on the upper surface of the seed layer 172. The photoresist pattern 180 may have a first opening 182 that exposes the patterned portion 146 of the second insulation pattern 140 and the central portion of the ball land 132 of the RDL 130, and a second opening 184 that may expose the edge portion of the ball land 132 and a part of the upper surface of the second insulation pattern 140. Thus, a portion of the seed layer 172 on the patterned portion 146 and the central portion of the ball land 132 of the RDL 130 may be exposed through the first opening 182. Further, a portion of the seed layer 172 on the edge portion of the ball land 132 of the RDL 130 and a portion of the seed layer 172 on the part of the upper surface of the second insulation pattern 140 may be exposed through the second opening 184. The first opening 182 and the second opening 184 may have an annular shape.

Figure 6:
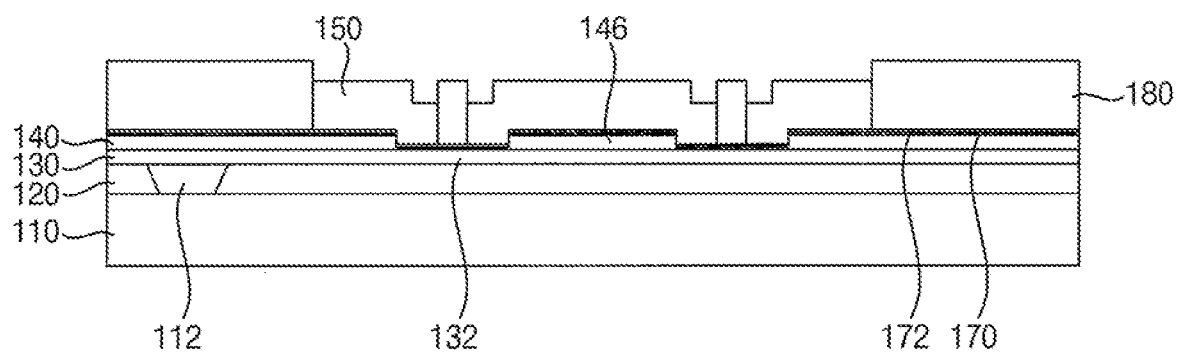

Referring to FIG. 6, a plating process may be performed on the portions of the seed layer 172 exposed through the first opening 182 and the second opening 184 to form the UBM 150. The UBM 150 formed by the plating process may have a uniform thickness. Thus, a portion of the UBM 150 on the upper surfaces of the second insulation pattern 140 and the patterned portion 146 may have an upper surface higher than an upper surface of a portion of the UBM 150 on the ball land 132.

Figure 7:
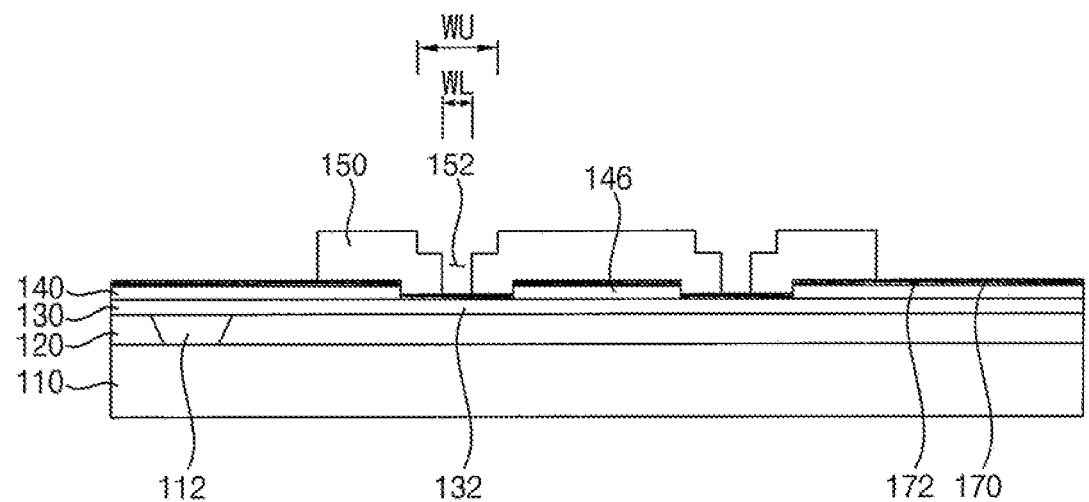

Referring to FIG. 7, the photoresist pattern 180 may be removed to form the first locking hole 152 in the UBM 150. The first locking hole 152 may be vertically formed through the UBM 150 to expose the seed layer 172 on the ball land 132 of the RDL 130. Further, as described above, because the upper surface of the portion of the UBM 150 on the upper surfaces of the second insulation pattern 140 and the patterned portion 146 may be a surface that is higher than the upper surface of the portion of the UBM 150 on the ball land 132, the first locking hole 152 may have the stepped structure having the upper width WU and the lower width WL narrower than the upper width WU.

Figure 8:
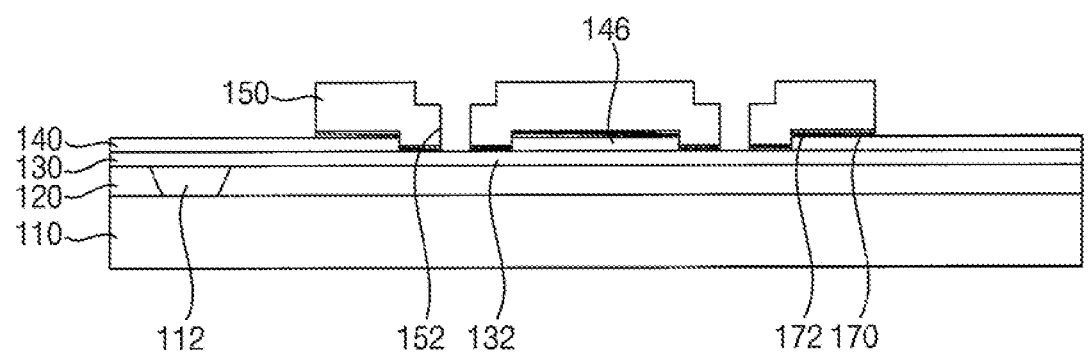

Referring to FIG. 8, the seed layer 172 and the barrier layer 170 may then be removed. Thus, the ball land 132 of the RDL 130 may be exposed through the first locking hole 152. For example, the edge portion of the upper surface of the ball land 132 may be exposed through the first locking hole 152.

The conductive ball 160 may be attached to the upper surface of the UBM 150. When a reflow process is performed on the conductive ball 160, a part of the conductive ball 160 may enter into the first locking hole 152. Thus, the first locking portion 162 inserted into the first locking hole 152 may be formed on the conductive ball 160 to complete the semiconductor package 100 in FIG. 1.

Figure 9:
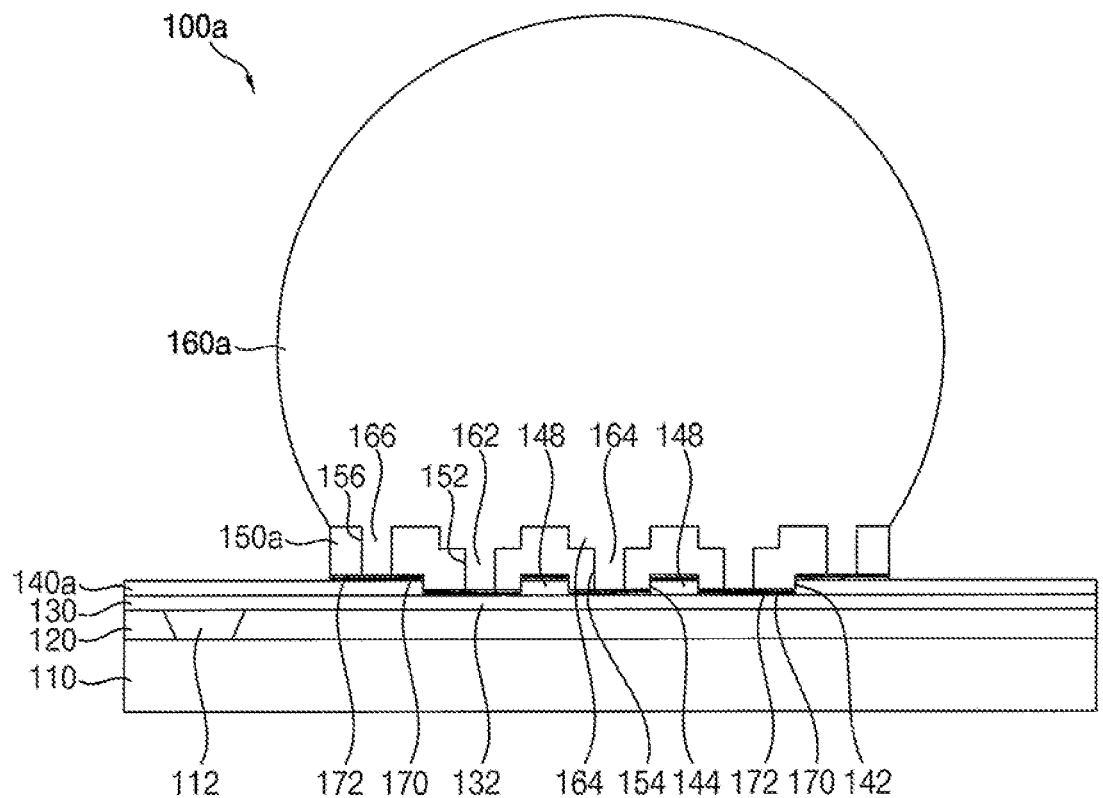
FIG. 9 is a cross-sectional view illustrating a semiconductor package in accordance with an example embodiment.
Figure 10:
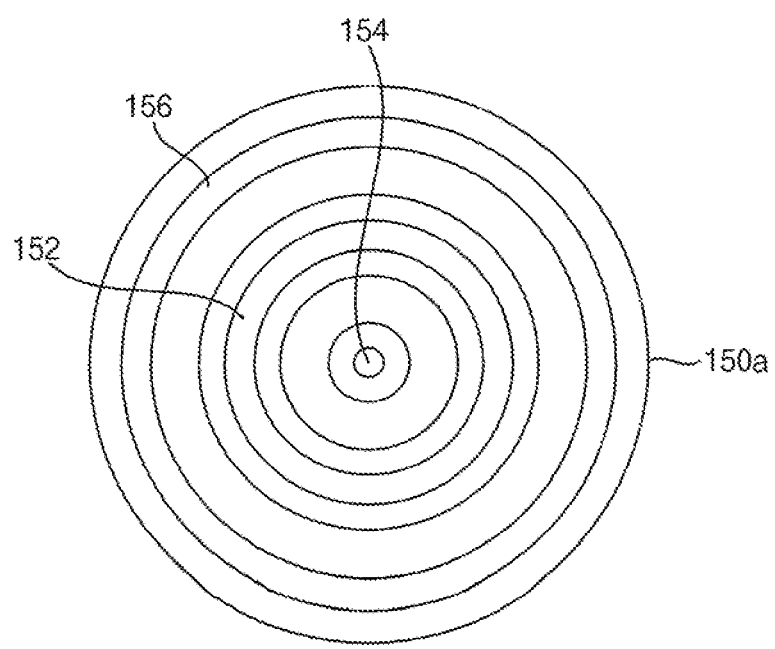

FIG. 9 is a cross-sectional view illustrating a semiconductor package in accordance with an example embodiment, and FIG. 10 is an enlarged plan view illustrating a UBM of the semiconductor package in FIG. 9.

A semiconductor package 100a in accordance with the present example embodiment may include elements substantially the same as those of the semiconductor package 100 in FIG. 1 except for a second insulation pattern, a UBM, and a conductive ball. Thus, the same reference numerals may refer to the same elements and any further illustrations with respect to the same elements may be omitted herein for brevity.

Referring to FIGS. 9 and 10, a second insulation pattern 140a may further include a second opening 144. The second opening 144 may be formed through the central portion of the patterned portion 146 in FIG. 1. Thus, the second insulation pattern 140a may further include an annular second patterned portion 148 formed by the second opening 144. Therefore, the second opening 144 may have a circular shape surrounded by the opening 142. The opening 142 may expose the edge portion of the ball land 132 of the RDL. The second opening 144 may expose the central portion of the ball land 132 of the RDL 130.

A UBM 150a may include the first locking hole 152 that may expose the seed layer 172 on the upper surface of the ball land 132. Thus, the barrier layer 170 and the seed layer 172 may be arranged on the upper surface of the ball land 132 exposed through the first locking hole 152. Thus, a conductive ball 160a may include the first locking portion 162 inserted into the first locking hole 152. The first locking portion 162 may make contact with the seed layer 172. In another implementation, as shown in FIG. 1, the barrier layer 170 and the seed layer 172 under the first locking hole 152 may be removed so that the first locking portion 162 of the conductive ball 160a may directly contact with the ball land 132.

The UBM 150a may further include a second locking hole 154. The second locking hole 154 may expose the central portion of the upper surface of the ball land 132 in the RDL 130. Because the seed layer 172 may be formed on the upper surface of the ball land 132, the portion of the seed layer 172 on the central portion of the upper surface of the ball land 132 may be exposed through the second locking hole 154. Thus, the second locking hole 154 may be surrounded by the first locking hole 152. Further, the second locking hole 154 may have a circular shape. The second locking hole 154 may have a vertical structure substantially the same as that of the first locking hole 152. Thus, any further illustrations with respect to the vertical structure of the second locking hole 154 may be omitted herein for brevity.

The UBM 150a may further include a peripheral locking hole 156. The peripheral locking hole 156 may expose an upper surface of the second insulation pattern 140a adjacent to the opening 142. Because the seed layer 172 may be formed on the upper surface of the second insulation pattern 140a, the portion of the seed layer 172 on the upper surface of the second insulation pattern 140a may be exposed through the peripheral locking hole 156. Thus, the peripheral locking hole 156 may have an annular shape that surrounds the first locking hole 152. Further, the peripheral locking hole 156 may have a uniform width. In another implementation, the peripheral locking hole 156 may have different widths.

A conductive ball 160a may further include a second locking portion 164. The second locking portion 164 may be inserted into the second locking hole 154. The second locking portion 164 may make contact with the central portion of the upper surface of the ball land 132. As described above, when the seed layer 172 may be formed on the ball land 132, the second locking portion 164 may make contact with the portion of the seed layer 172 on the central portion of the upper surface of the ball land 132.

The conductive ball 160a may further include a peripheral locking portion 166. The peripheral locking portion 166 may be inserted into the peripheral locking hole 156. The peripheral locking portion 166 may make contact with the upper surface of the second insulation pattern 140a. As described above, when the seed layer 172 may be formed on the upper surface of the second insulation pattern 140a, the peripheral locking portion 166 may make contact with the portion of the seed layer 172 on the upper surface of the second insulation pattern 140a.

According to an example embodiment, the first and second locking portions 162 and 164 and the peripheral locking portion 166 of the conductive ball 160a may make contact with inner surfaces of the first and second locking holes 152 and 154 and the peripheral locking hole 156 to more increase the contact area between the UBM 150 and the conductive ball 160. Further, the first and second locking portions 162 and 164 and the peripheral locking portion 166 inserted into the first and second locking holes 152 and 154 and the peripheral locking hole 156, respectively, may form a firm uneven structure to reinforce a combination structure between the conductive ball 160a and the UBM 150a. As a result, the adhesion force between the conductive ball 160a and the UBM 150a may be significantly increased to prevent the joint region between the conductive ball 160a and the UBM 150a from being damaged by the difference of the thermal expansion coefficients between the RDL 130 and the first and second insulation patterns 120 and 140a.

FIGS. 11 to 16 are cross-sectional views illustrating a method of manufacturing the semiconductor package in FIG. 9.

Figure 11:
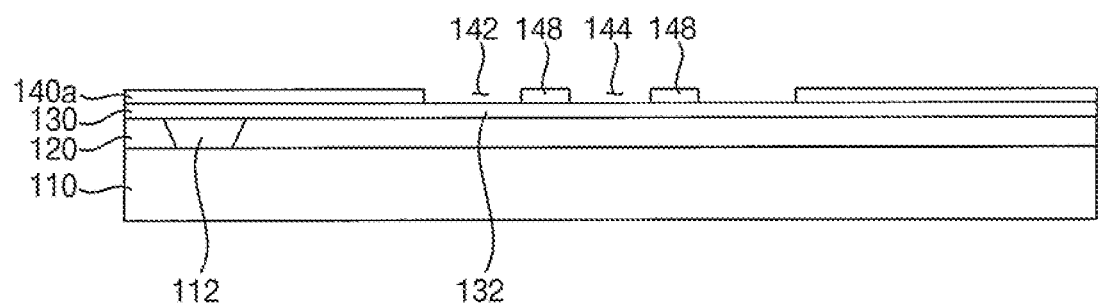
FIGS. 11 to 16 are cross-sectional views illustrating a method of manufacturing the semiconductor package in FIG. 9.

Referring to FIG. 11, the first insulation pattern 120 may be formed on the upper surface of the semiconductor chip 110. The pad 112 of the semiconductor chip 110 may be exposed through the opening of the first insulation pattern 120. The RDL 130 may be formed on the upper surface of the first insulation pattern 120. The RDL 130 may be electrically connected to the pad 112.

The second insulation pattern 140a including the opening 142, the second opening 144, and the second patterned portion 148 may be formed on the upper surface of the first insulation pattern 120. The edge portion of the upper surface of the ball land 132 in the RDL 130 may be exposed through the opening 142 of the second insulation pattern 140a. The central portion of the upper surface of the ball land 132 in the RDL 130 may be exposed through the second opening 144 of the second insulation pattern 140a.

Figure 12:
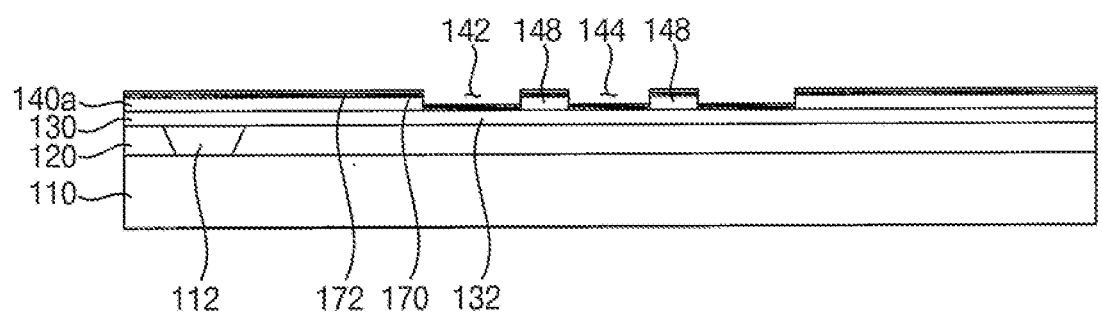

Referring to FIG. 12, the barrier layer 170 and the seed layer 172 may be sequentially formed on the upper surfaces of the second insulation pattern 140a, the second patterned portion 148 and the RDL 130.

Figure 13:
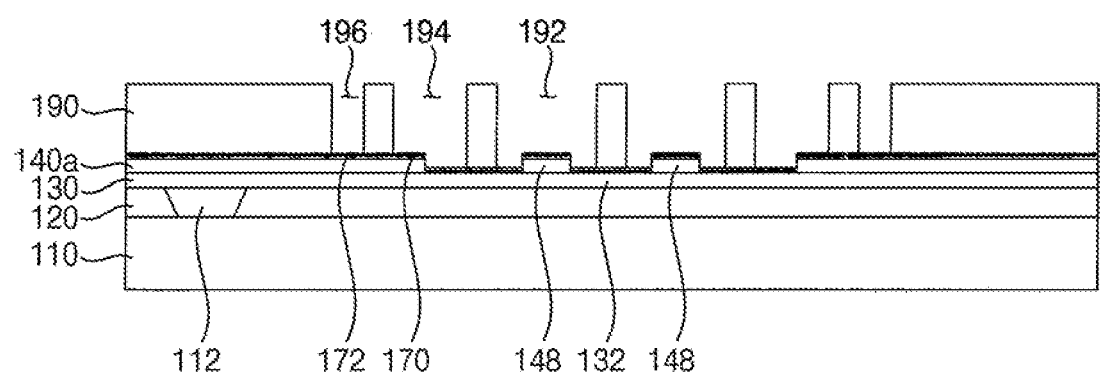

Referring to FIG. 13, a photoresist pattern 190 may be formed on the upper surface of the seed layer 172. The photoresist pattern 190 may have a first opening 192, a second opening 194 that may surround the first opening 192, and a third opening 196 that surrounds the second opening 194. The first opening 192 may expose the second patterned portion 148 of the second insulation pattern 140a and the central portion of the ball land 132 of the RDL 130. The second opening 194 may expose the edge portion of the ball land 132 and a part of the upper surface of the second insulation pattern 140a connected to the ball land 132. The third opening 196 may expose a portion of the second insulation pattern 140a spaced apart from the ball land 132 and that may surround the ball land 132. Thus, the portion of the seed layer 172 on the second patterned portion 148 and the central portion of the ball land 132 of the RDL 130 may be exposed through the first opening 192. The portion of the seed layer 172 on the edge portion of the ball land 132 of the RDL 130 and a portion of the seed layer 172 on the part of the upper surface of the second insulation pattern 140a may be exposed through the second opening 194. A portion of the seed layer 172 on the portion of the second insulation pattern 140a that surrounds the ball land 132 may be exposed through the third opening 196. The first opening 192, the second opening 194 and the third opening 196 may have an annular shape.

Figure 14:
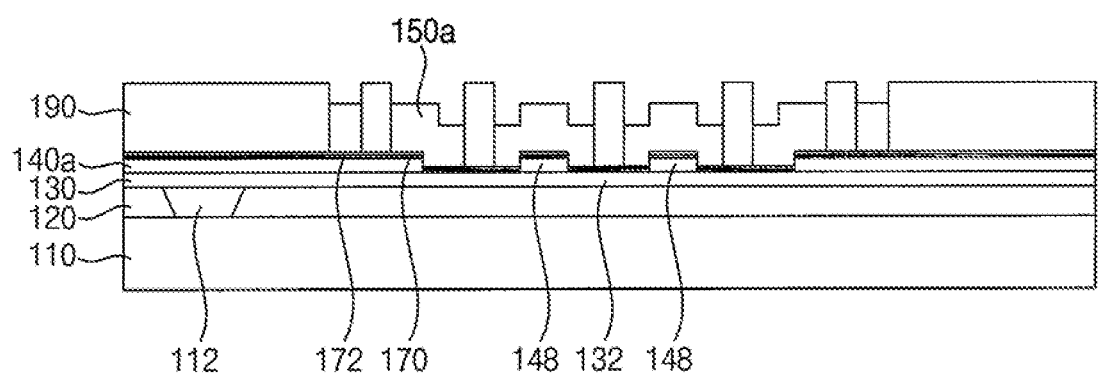

Referring to FIG. 14, a plating process may be performed on the portions of the seed layer 172 exposed through the first opening 192, the second opening 194, and the third opening 196 to form the UBM 150a. The UBM 150a formed by the plating process may have a uniform thickness. Thus, a portion of the UBM 150a on the upper surfaces of the second insulation pattern 140a and the second patterned portion 148 may have an upper surface higher than an upper surface of a portion of the UBM 150a on the ball land 132.

Figure 15:
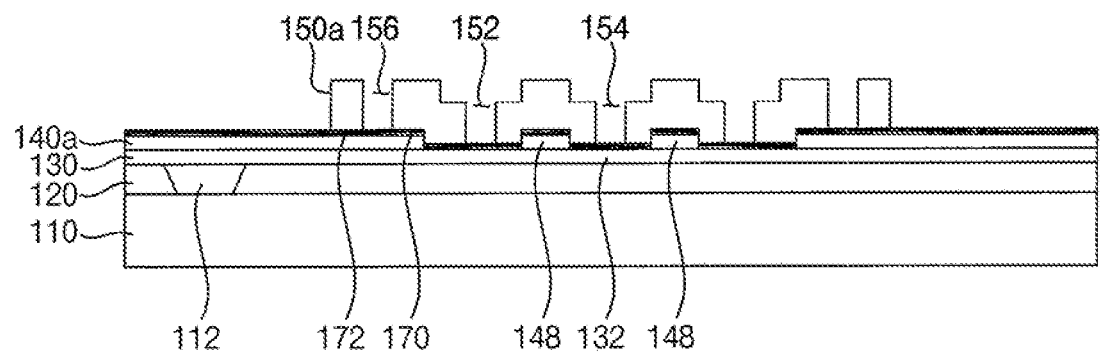

Referring to FIG. 15, the photoresist pattern 190 may be removed to form the first locking hole 152, the second locking hole 154, and the peripheral locking hole 156 in the UBM 150a. The first locking hole 152 may be vertically formed through the UBM 150a to expose the seed layer 172 on the edge portion of the upper surface of ball land 132 in the RDL 130. The second locking hole 154 may be vertically formed through the UBM 150a to expose the seed layer 172 on the central portion of the upper surface of the ball land 132 in the RDL 130. The peripheral locking hole 156 may be vertically formed through the UBM 150a to expose the seed layer 172 on the second insulation pattern 140a.

Figure 16:
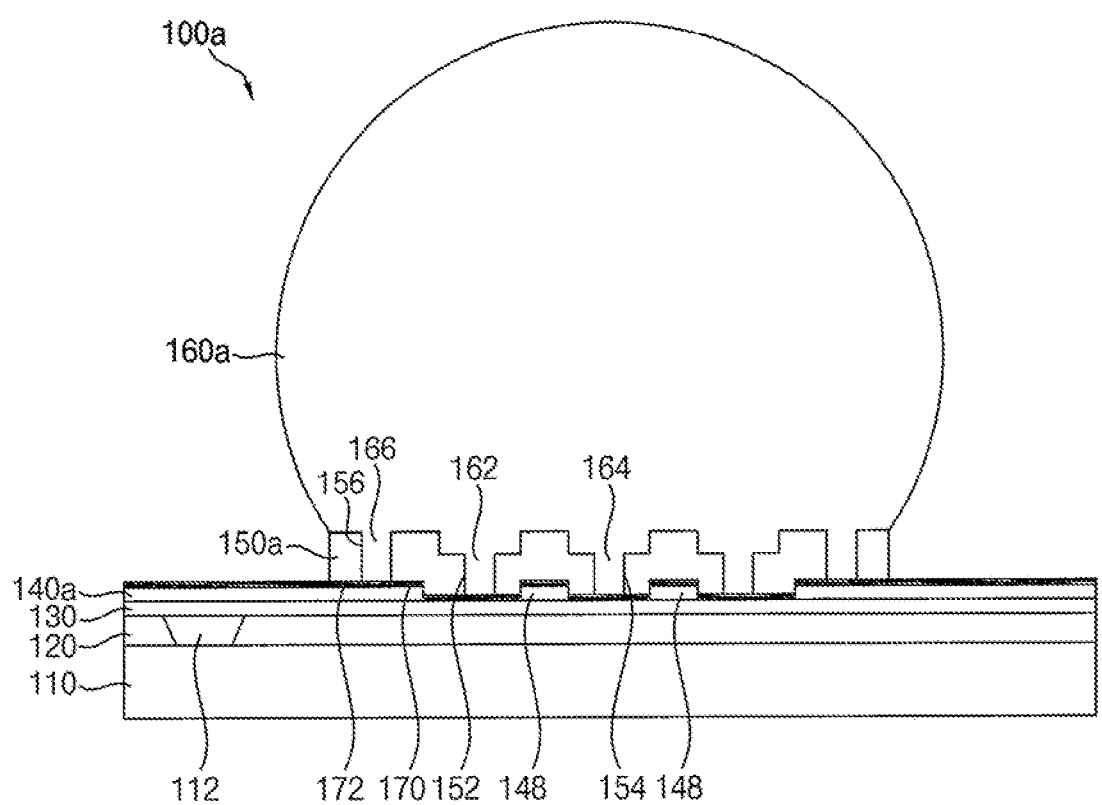

Referring to FIG. 16, the conductive ball 160a may be attached to the upper surface of the UBM 150a. When a reflow process may be performed on the conductive ball 160a, a part of the conductive ball 160a may enter into the first locking hole 152, the second locking hole 154, and the peripheral locking hole 156. The seed layer 172 and the barrier layer 170 on the second insulation pattern 140a may reinforce the adhesion force between the peripheral locking portion 166 and the second insulation pattern 140a. Thus, the first locking portion 162 inserted into the first locking hole 152, the second locking portion 164 inserted into the second locking hole 154, and the peripheral locking portion 166 inserted into the peripheral locking hole 156 may be formed on the conductive ball 160a.

The portions of the seed layer 172 and the barrier layer 170 on the second insulation pattern 140a, i.e., the portions of the seed layer 172 and the barrier layer 170 not covered by the conductive ball 160a, may then be removed to complete the semiconductor package 100a in FIG. 9

Figure 17:
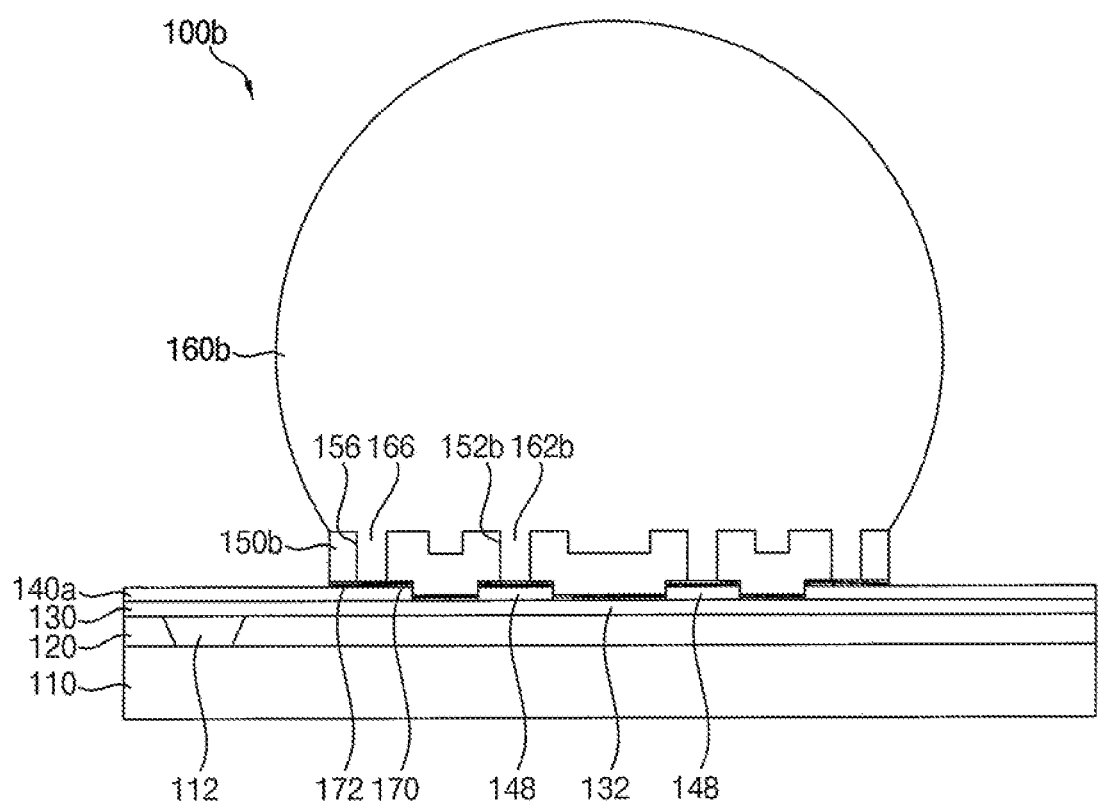
FIG. 17 is a cross-sectional view illustrating a semiconductor package in accordance with an example embodiment.

FIG. 17 is a cross-sectional view illustrating a semiconductor package in accordance with an example embodiment.

A semiconductor package 100b in accordance with the present example embodiment may include elements substantially the same as those of the semiconductor package 100a in FIG. 9 except for vertical structures of a UBM and a conductive ball. Thus, the same reference numerals may refer to the same elements and any further illustrations with respect to the same elements may be omitted herein for brevity.

Referring to FIG. 17, a UBM 150b may be formed on the upper surface of the second insulation pattern 140a and a part of the upper surface of the second patterned portion 148. The UBM 150b may be configured to fully fill the opening 142 and the second opening 144 of the second insulation pattern 140a. The UBM 150b may make electrical contact with the ball land 132.

The UBM 150b may include a first locking hole 152b. The first locking hole 152b may be formed through the UBM 150b on the second patterned portion 148 to expose the part of the upper surface of the second patterned portion 148. When the seed layer 172 may be formed on the part of the upper surface of the second patterned portion 148, the seed layer 172 on the second patterned portion 148 may be exposed through the first locking hole 152b.

The UBM 150b may further include a peripheral locking hole 156. The peripheral locking hole 156 in accordance with the present example embodiment may have a structure substantially the same as that of the peripheral locking hole 156 in FIG. 9. Thus, any further illustrations with respect to the peripheral locking hole 156 may be omitted herein for brevity. A peripheral locking portion 166 of a conductive ball 160b inserted into the peripheral locking hole 156 may also have a structure substantially the same as that of the peripheral locking portion 166 in FIG. 9. Thus, any further illustrations with respect to the peripheral locking portion 166 may be omitted herein for brevity.

The conductive ball 160b may include a first locking portion 162b. The first locking portion 162b may be inserted into the first locking hole 152b. The first locking portion 162b may make contact with the upper surface of the second patterned portion 148. As described above, when the seed layer 172 may be formed on the second patterned portion 148, the seed layer 172 on the second patterned portion 148 may make contact with the first locking portion 162b. The seed layer 172 and the barrier layer 170 may function as to reinforce the adhesion force between the first locking portion 162b and the second patterned portion 148.

Figure 18:
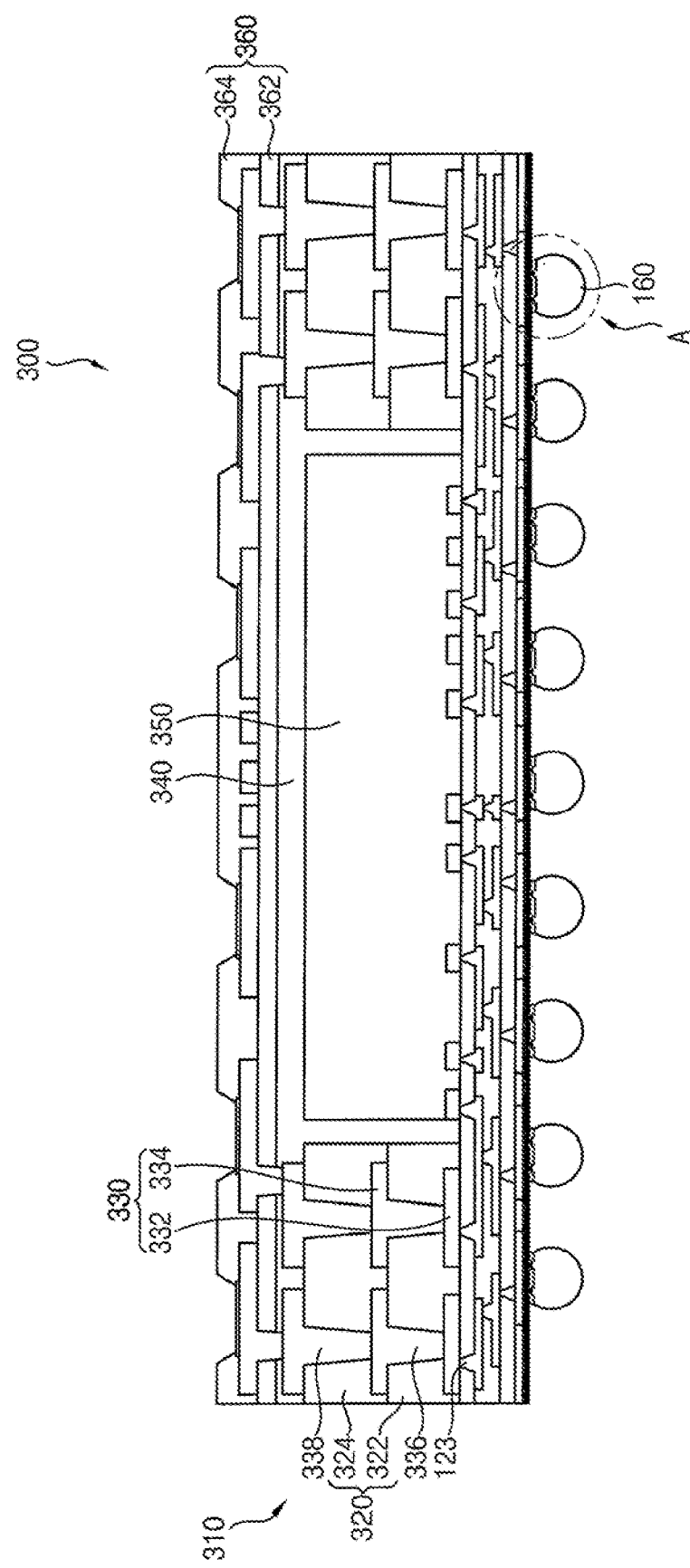
FIG. 18 is a cross-sectional view illustrating a semiconductor package in accordance with an example embodiment.
Figure 19:
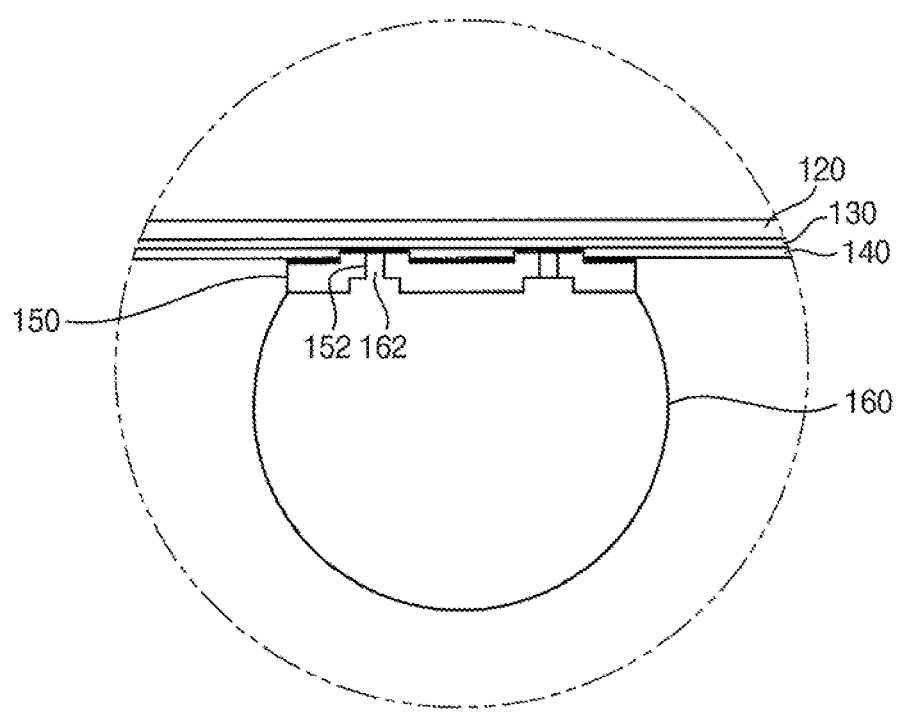
FIG. 19 is an enlarged cross-sectional view of a portion "A" in FIG. 18.

FIG. 18 is a cross-sectional view illustrating a semiconductor package in accordance with an example embodiment, and FIG. 19 is an enlarged cross-sectional view of a portion "A" in FIG. 18.

Referring to FIGS. 18 and 19, a semiconductor package 300 in accordance with the present example embodiment may include a fan-out type semiconductor package. The fan-out type semiconductor package 300 may include a frame 310, a semiconductor chip 350, a molding member 340, a lower redistribution structure, an upper redistribution structure, and an upper insulation layer 360.

The structures of the UBM 150 and the conductive ball 160 in FIG. 1 may be applied to the lower redistribution structure. In another implementation, the structure in FIG. 9 or FIG. 17 may be applied to the lower redistribution structure.

The frame 310 may be arranged on the upper surface of a package substrate. The frame 310 may include an insulation substrate 320 and a middle RDL 330. The insulation substrate 320 may have a cavity 312. The cavity 312 may be vertically formed through a central portion of the insulation substrate 320. The middle RDL 330 may be formed in the insulation substrate 320.

The insulation substrate 320 may include a first insulation layer 322 and a second insulation layer 324. The first insulation layer 322 may have an opening vertically formed through the first insulation layer 322. The second insulation layer 324 may be formed on an upper surface of the first insulation layer 322. The second insulation layer 324 may have an opening vertically formed through the second insulation layer 324.

The middle RDL 330 may include a first middle redistribution pattern 332 and a second middle redistribution pattern 334. The first middle redistribution pattern 332 may be formed on a lower surface of the first insulation layer 322. The second middle redistribution pattern 334 may be formed on the upper surface of the first insulation layer 322. The opening of the first insulation layer 322 may be filled with a first contact 336. Thus, the first middle redistribution pattern 332 and the second middle redistribution pattern 334 may be electrically connected with each other via the first contact 336. The opening of the second insulation layer 324 may be filled with a second contact 338. The second contact 338 may be electrically connected to the second middle redistribution pattern 334. An upper surface of the second contact 338 may be upwardly exposed.

In another implementation, the insulation substrate 320 may include a single insulation layer. In this case, the middle RDL 330 include a single layer may be exposed through the upper surface of the single insulation substrate 320. Further, the insulation substrate 320 may include at least three insulation layers.

The semiconductor chip 350 may be arranged in the cavity 312 of the insulation substrate 320. The semiconductor chip 350 may include a plurality of pads 352. The pads 352 may be arranged on a lower surface of the semiconductor chip 350.

The molding member 340 may function as a mold for the semiconductor chip 350. In an example embodiment, the molding member 340 may be formed on the upper surface of the insulation substrate 320 to fill a space between the semiconductor chip 350 and an inner surface of the cavity 312.

The upper insulation layer 360 may be formed on an upper surface of the molding member 340. In an example embodiment, the upper insulation layer 360 may include, for example, a photo imageable dielectric (PID) or another insulation material.

The upper insulation layer 360 may include a first insulation layer 362 and a second insulation layer 364. The first insulation layer 362 may be formed on the upper surface of the molding member 340. The first insulation layer 362 may have an opening that exposes the second middle redistribution pattern 334.

The upper RDL 370 may be formed on an upper surface of the first insulation layer 362 to fill the opening of the first insulation layer 362. Thus, the upper RDL 370 may be electrically connected to the second middle redistribution pattern 334.

The second insulation layer 364 may be formed on the upper surface of the first insulation layer 362. The second insulation layer 364 may have an opening that exposes the upper RDL 370.

In another implementation, the semiconductor package 300 in accordance with the present example embodiment may include a structure without the upper RDL 370 and the upper insulation layer 360.

Figure 20:
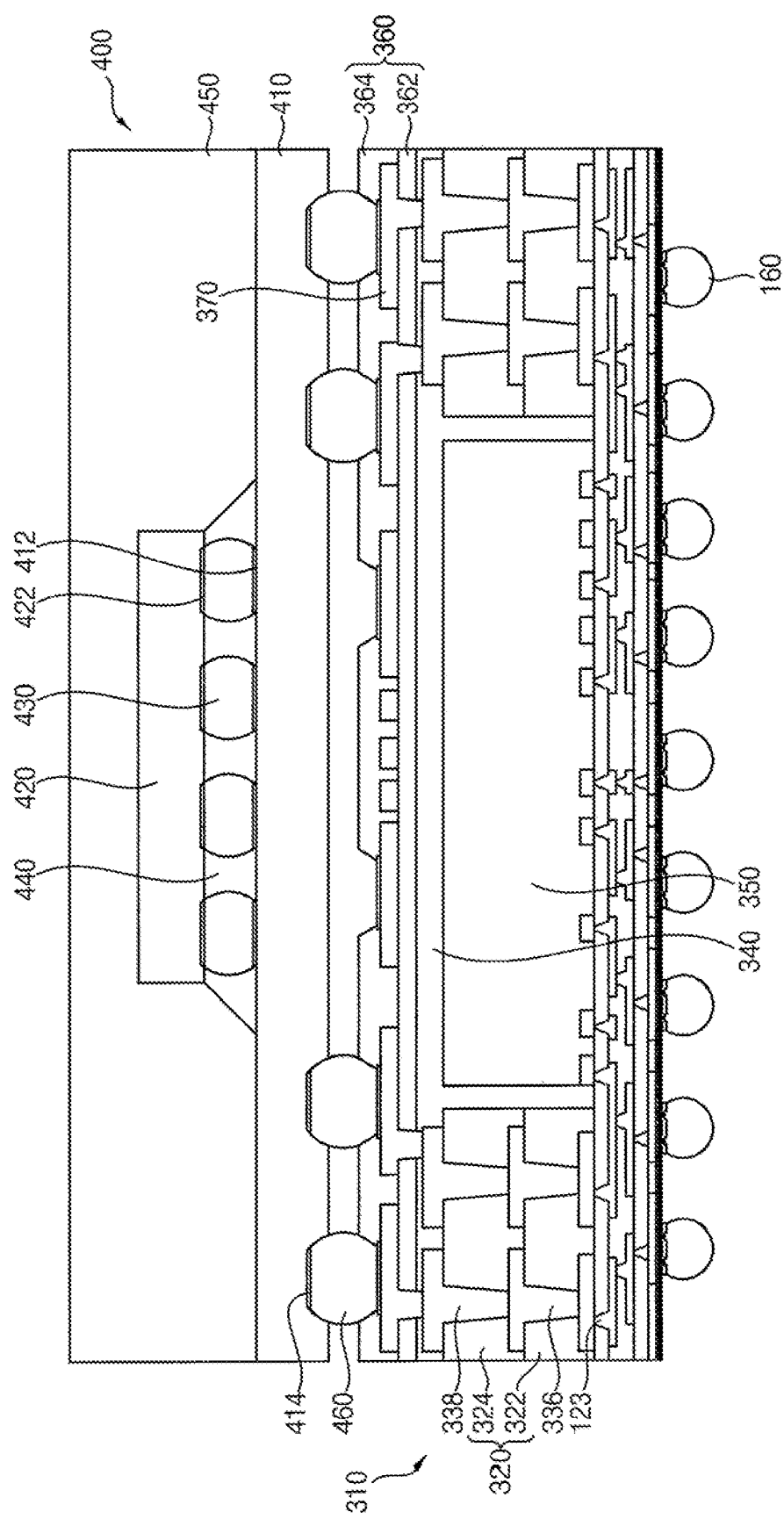
FIG. 20 is a cross-sectional view illustrating a semiconductor package in accordance with an example embodiment.

FIG. 20 is a cross-sectional view illustrating a semiconductor package in accordance with an example embodiment.

Referring to FIG. 20, a semiconductor package 400 in accordance with the present example embodiment may further include a second semiconductor package stacked on the semiconductor package 300 in FIG. 18. Thus, the semiconductor package 400 in accordance with the present example embodiment may have a package-on-package (POP) structure.

The second semiconductor package may include a package substrate 410, a second semiconductor chip 420, conductive bumps 430, an underfilling layer 440, and a molding member 450.

The package substrate 410 may be electrically connected with the semiconductor package 300 in FIG. 18 via the conductive bumps 460 such as solder balls. Thus, the conductive bumps 460 may be mounted on the upper RDL 370 of the semiconductor package 300 in FIG. 18. A lower surface of the package substrate 410 may be electrically connected with the upper RDL 370 of the semiconductor package 300 via the conductive bumps 460.

The package substrate 410 may include a plurality of lower pads 414 and a plurality of upper pads 412. The lower pads 414 may be arranged on the lower surface of the package substrate 410 to electrically make contact with the conductive bumps 460. The upper pads 412 may be arranged on the upper surface of the package substrate 410.

The second semiconductor chip 420 may be arranged over the package substrate 410. The second semiconductor chip 420 may include a plurality of pads 422. The pads 422 may be arranged on a lower surface of the second semiconductor chip 420.

The conductive bumps 430 may be interposed between the package substrate 410 and the second semiconductor chip 420. For example, the conductive bumps 430 may be electrically connected between the upper pads 412 of the package substrate 410 and the pads 422 of the second semiconductor chip 420.

The underfilling layer 440 may be interposed between the package substrate 410 and the second semiconductor chip 420 to surround the conductive bumps 430. The underfilling layer 440 may include an insulation material such as epoxy resin.

The molding member 450 may be formed on the upper surface of the package substrate 410 to cover the second semiconductor chip 420. The molding member 450 may include an epoxy molding compound (EMC).

Figure 21:
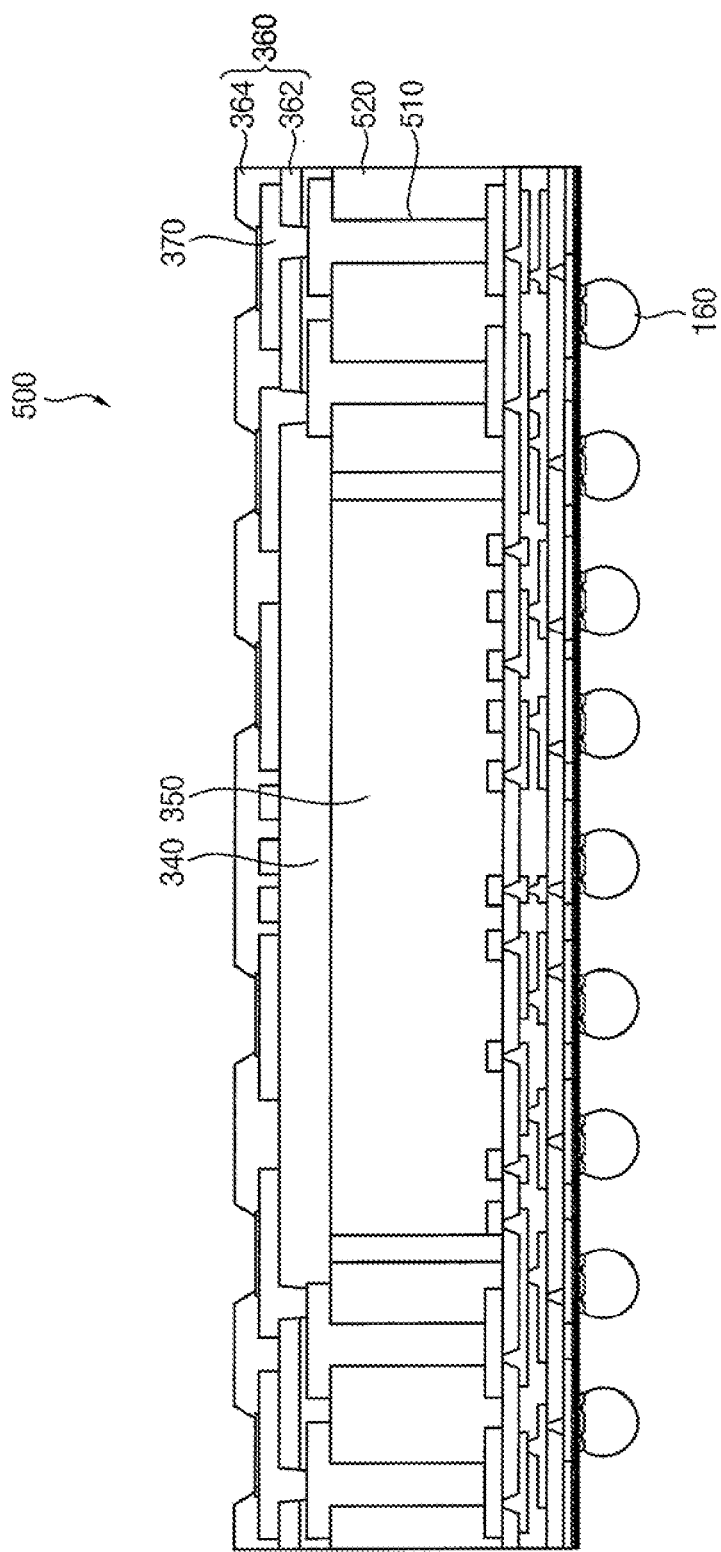
FIG. 21 is a cross-sectional view illustrating a semiconductor package in accordance with an example embodiment.

FIG. 21 is a cross-sectional view illustrating a semiconductor package in accordance with an example embodiment.

Referring to FIG. 21, a semiconductor package 500 in accordance with the present example embodiment may include a fan-out type wafer level package. Thus, the semiconductor package 500 in accordance with the present example embodiment may include a lower redistribution structure, a semiconductor chip 350, a molding member 520, a post 510, an upper RDL 370, and an upper insulation layer 360.

The structures of the UBM 150 and the conductive ball 160 in FIG. 1 may be applied to the lower redistribution structure. In another implementation, the structure in FIG. 9 or FIG. 17 may be applied to the lower redistribution structure.

The molding member 520 may be formed on the upper surface of the lower redistribution structure to surround side surfaces of the semiconductor chip 350. The molding member 520 may correspond to a part of a wafer.

The post 510 may be vertically formed through the molding member 520. A lower end of the post 510 may be electrically connected to the package substrate. For example, the lower end of the post 510 may be electrically connected to the first contact 123 of the first RDL 122. The post 510 may include a metal such as copper.

The upper insulation layer 360 and the upper RDL 370 may have structures substantially the same as those in FIG. 10, respectively. Thus, any further illustrations with respect to the upper insulation layer 360 and the upper RDL 370 may be omitted herein for brevity. An upper end of the post 510 may be electrically connected to the upper RDL 370.

In another implementation, the semiconductor package 500 in accordance with the present example embodiment may include a structure without the upper RDL 370 and the upper insulation layer 360.

By way of summation and review, a first insulation pattern may be formed on an upper surface of a semiconductor chip. The first insulation pattern may have an opening that exposes a pad of the semiconductor chip. An RDL may be formed on an upper surface of the first insulation pattern. The RDL may be electrically connected to the pad. A second insulation pattern may be formed on the upper surface of the first insulation pattern. The second insulation pattern may have an opening that exposes the RDL. The UBM may be formed on the exposed RDL. The conductive ball may be mounted on the UBM. When the RDL and the insulation patterns have different thermal expansion coefficients, adhesion force between the UBM on the RDL and the conductive ball may be weakened.

According to an example embodiment, the first locking portion of the conductive ball may be inserted into the first locking hole of the UBM to increase a contact area between the conductive ball and the UBM. Further, the first locking portion and the UBM may form an uneven structure so that the conductive ball may be firmly combined with the UBM. Thus, adhesion force between the conductive ball and the UBM may be significantly enhanced. As a result, a damage to a joint region between the conductive ball and the UBM, which may be caused by a difference between thermal expansion coefficients between the RDL and the insulation pattern, may be prevented.

As described above, embodiments relate to a wafer level package and a method of manufacturing the wafer level package. Embodiments may provide a semiconductor package with enhanced adhesion between a UBM and a conductive ball, and a method of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a semiconductor chip including a pad;
   a first insulation pattern on an upper surface of the semiconductor chip and exposing the pad;
   a redistribution layer (RDL) on an upper surface of the first insulation pattern and electrically connected to the pad;
   a second insulation pattern on the upper surface of the first insulation pattern, the second insulation pattern including at least one opening that exposes a ball land of the RDL and at least one patterned portion located in the opening;
   an under bump metal (UBM) on upper surfaces of the second insulation pattern and the patterned portion and filling the opening, the UBM including a first hole that exposes an edge portion of an upper surface of the ball land and at least one branch that crosses the first hole in a radial direction of the UBM; and a conductive ball on an upper surface of the UBM, the conductive ball including a first locking portion in the first hole, wherein the first hole has an area of about 10% to about 50% of an area of the upper surface of the UBM.

2. The semiconductor package as claimed in claim 1, wherein the first hole has an annular shape.

3. The semiconductor package as claimed in claim 1, wherein:
the UBM further includes a second hole located in the first hole and exposing a central portion of the upper surface of the ball land, and
the conductive ball further includes a second locking portion in the second hole.

4. The semiconductor package as claimed in claim 1, wherein:
the UBM further includes a peripheral hole that exposes the upper surface of the second insulation pattern, and
the conductive ball further includes a peripheral locking portion in the peripheral hole.

5. The semiconductor package as claimed in claim 4, wherein the peripheral hole surrounds the first hole.

6. The semiconductor package as claimed in claim 1, further comprising a seed layer interposed between the second insulation pattern and the UBM, and interposed between the RDL and the UBM.

7. The semiconductor package as claimed in claim 6, further comprising a barrier layer interposed between the seed layer and the second insulation pattern, and interposed between the seed layer and the RDL.

8. A semiconductor package, comprising:
a semiconductor chip including a pad;
a first insulation pattern on an upper surface of the semiconductor chip and exposing the pad;
a redistribution layer (RDL) on an upper surface of the first insulation pattern and electrically connected to the pad;
a second insulation pattern on the upper surface of the first insulation pattern, the second insulation pattern including at least one opening that exposes a ball land of the RDL, and at least one patterned portion located in the opening;
an under bump metal (UBM) on upper surfaces of the second insulation pattern and the patterned portion and filling the opening, the UBM including a hole and at least one branch that crosses the hole in a radial direction of the UBM; and
a conductive ball on an upper surface of the UBM, the conductive ball including a locking portion in the hole.

9. The semiconductor package as claimed in claim 8, wherein the hole includes:
a first hole that exposes an edge portion of an upper surface of the ball land; and
a second hole that exposes a central portion of the upper surface of the ball land.

10. The semiconductor package as claimed in claim 9, wherein the locking portion includes:

a first locking portion in the first hole; and
a second locking portion in the second hole.

11. The semiconductor package as claimed in claim 8, wherein the hole has an area of about 10% to about 50% of an area of the upper surface of the UBM.

12. The semiconductor package as claimed in claim 8, wherein the hole has an annular shape.

13. The semiconductor package as claimed in claim 12, wherein the hole has an upper width and a lower width narrower than the upper width.

14. The semiconductor package as claimed in claim 8, wherein:
the UBM further includes a peripheral hole that exposes the upper surface of the second insulation pattern, and
the conductive ball further includes a peripheral locking portion in the peripheral hole.

15. The semiconductor package as claimed in claim 14, wherein the peripheral hole surrounds the hole.

16. The semiconductor package as claimed in claim 8, further comprising a seed layer interposed between the second insulation pattern and the UBM, and interposed between the RDL and the UBM.

17. The semiconductor package as claimed in claim 16, further comprising a barrier layer interposed between the seed layer and the second insulation pattern, and interposed between the seed layer and the RDL.

18. A method of manufacturing a semiconductor package, the method comprising:
forming a first insulation pattern on an upper surface of a semiconductor chip to expose a pad of the semiconductor chip;
forming a redistribution layer (RDL) on an upper surface of the first insulation pattern, the RDL being electrically connected to the pad;
forming a second insulation pattern on the upper surface of the first insulation pattern, the second insulation pattern including at least one opening that exposes a ball land of the RDL and including at least one patterned portion located in the opening;
forming an under bump metal (UBM) on upper surfaces of the second insulation pattern and the patterned portion to fill the opening, the UBM including a hole that exposes the ball land and at least one branch that crosses the hole in a radial direction of the UBM; and
forming a conductive ball on an upper surface of the UBM, the conductive ball including a locking portion inserted into the hole.

19. The method as claimed in claim 18, wherein forming the UBM having the hole includes:
forming a first hole through the UBM to expose an edge portion of an upper surface of the ball land; and
forming a second hole through the UBM to expose a central portion of the upper surface of the ball land.

20. The method as claimed in claim 18, further comprising forming a peripheral hole through the UBM to expose the upper surface of the second insulation pattern, wherein forming the conductive ball further includes filling the peripheral hole with the conductive ball.

* * * * *